(12) United States Patent
Nokita (10) Patent No.: US 7,129,499 B2
(45) Date of Patent: Oct. 31, 2006

(54) RADIOGRAPHIC APPARATUS AND RADIOGRAPHIC METHOD

(75) Inventor: Makoto Nokita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 242 days.

(21) Appl. No.: 10/871,211

(22) Filed: Jun. 18, 2004

(65) Prior Publication Data

US 2004/0256567 A1  Dec. 23, 2004

(30) Foreign Application Priority Data

Jun. 18, 2003  (JP) .............................. 2003-172869

(51) Int. Cl.
  *G01N 23/04*  (2006.01)
(52) U.S. Cl. ................. 250/370.09; 250/580
(58) Field of Classification Search ........... 250/370.08, 250/370.09, 580
  See application file for complete search history.

(56) References Cited

U.S. PATENT DOCUMENTS 5,563,421 A * 10/1996 Lee et al. .................... 250/580
5,841,180 A    11/1998 Kobayashi et al.
5,929,449 A *  7/1999 Huang .................... 250/370.09
5,969,360 A * 10/1999 Lee ....................... 250/370.09

FOREIGN PATENT DOCUMENTS

| EP | 0 948 930 A1 | 10/1999 |
| JP | 8-116044 | 5/1996 |
| JP | 2000-023968 | 1/2000 |
| JP | 2003-010159 | 1/2003 |

* cited by examiner

*Primary Examiner*—Otilia Gabor
(74) *Attorney, Agent, or Firm*—Morgan & Finnegan, L.L.P.

(57) ABSTRACT

A radiographic apparatus includes a radiation irradiating unit for applying radiation; a radiation imaging unit, including a plurality of imagers, for converting the radiation to image data; a determining unit for determining whether noise caused by residual charge is produced, from the distribution of the residual charge in the radiation imaging unit based on the image data; and a controlling unit for changing a driving state of the radiation imaging unit based on the determination result.

26 Claims, 7 Drawing Sheets

RADIOGRAPHIC APPARATUS AND RADIOGRAPHIC METHOD

BACKGROUND OF THE INVENTION

1. Field of the Invention

The present invention relates to a radiographic apparatus including a radiation imaging unit and, more particularly, to a radiographic apparatus and a radiographic method for controlling a radiographic process based on a state of the radiation imaging unit.

2. Description of the Related Art

Radiation imaging sensors have been suggested in recent years, which are capable of converting radiographic images into digital data in real time. For example, it has become possible to manufacture solid-state photodetectors in which solid-state photodetector elements are arranged in a matrix. This leads to the introduction of radiation imaging sensors each having the solid-state photodetectors and phosphors for converting radiation into visible light, the solid-state photodetectors and the phosphors being alternately layered. Each of the solid-state photodetector elements has a transparent conductive film and a conductive film with an amorphous semiconductor sandwiched therebetween on a substrate made of quartz. With such a radiation imaging sensor, image data can be acquired in the following manner. That is, the radiation imaging sensor that is irradiated with radiation transmitted through an object converts the radiation into visible light with the phosphors. The visible light is detected as electrical signals by photoelectric converters in the solid-state photodetector elements. The electrical signals are read out from the solid-state photodetector elements by a predetermined reading method and undergo analog-to-digital conversion for providing image signals. Such a solid-state photodetector is disclosed in Japanese Patent Laid-Open No. 8-116044. Furthermore, radiation imaging sensors have also been suggested which directly acquire radiation by using solid-state photodetectors without using phosphors.

The radiation imaging sensors described above detect the radiation intensity as the amount of electric charge. Hence, it is necessary to drive the radiation imaging sensor in a stable state in order to accurately accumulate radiation signals. For this purpose, a driving operation, such as discharge of dark current or discharge of stored charge, is performed.

However, applying radiation having a high intensity causes stored signal charge in the solid-state photodetector element to be saturated. After the signal charge is saturated, it is impossible to fully discharge the electric charge by the driving operation in an ordinal radiographic process, thus superimposing noise on the image data. The noise produced based on the storage state of the electric charge or the discharge state of the electric charge in the radiation imaging sensor is called a residual image. Such a problem is also pointed out in Japanese Patent Laid-Open No. 2000-023968. A countermeasure is suggested for eliminating the residual image caused by residual charge with optical reset in this publication. However, with such a method, the radiographic imaging sensor must have a reset device, thus undesirably requiring the space and cost of the reset device. In addition, adding a driving operation for fully discharging the residual charge between radiographic processes in preparation for the application of high-intensity radiation disadvantageously lengthens the radiographic cycle and thus lowers the turnover of radiography in a hospital or the like.

Applying high-intensity radiation sometimes superimposes the noise caused by the residual charge on the image data. Hitherto, various countermeasures against the superimposition of the noise have been expected.

SUMMARY OF THE INVENTION

It is an object of the present invention to provide a radiographic apparatus and a radiographic method capable of reducing the superimposition of noise caused by residual charge on image data based on the determination of the state of the residual charge.

The present invention provides, in its first aspect, a radiographic apparatus including a radiation irradiating unit for applying radiation; a radiation imaging unit, including a plurality of imagers, for converting the radiation to image data; a determining unit for determining whether noise caused by residual charge is produced, from the distribution of the residual charge in the radiation imaging unit based on the image data; and a controlling unit for changing a driving state of the radiation imaging unit based on the determination result.

The present invention provides, in its second aspect, a radiographic method including a radiation irradiating step for applying radiation; a radiation imaging step for converting the radiation to image data by using a plurality of imagers; a determining step for determining whether noise caused by residual charge is produced, from the distribution of the residual charge based on the image data obtained in the radiation imaging step; and a controlling step for changing a driving state of the radiation imaging step based on the determination result.

Further objects, features, and advantages of the present invention will become apparent from the following description of the preferred embodiments with reference to the attached drawings.

DESCRIPTION OF THE PREFERRED EMBODIMENTS

Radiographic apparatuses according to preferred embodiments of the present invention will now be described in detail with reference to the attached drawings. It should be noted that the relative arrangement of the components, the numerical expressions, and the numerical values set forth in these embodiments do not limit the scope of the present invention unless it is specifically stated otherwise.

First Embodiment

Figure 1:
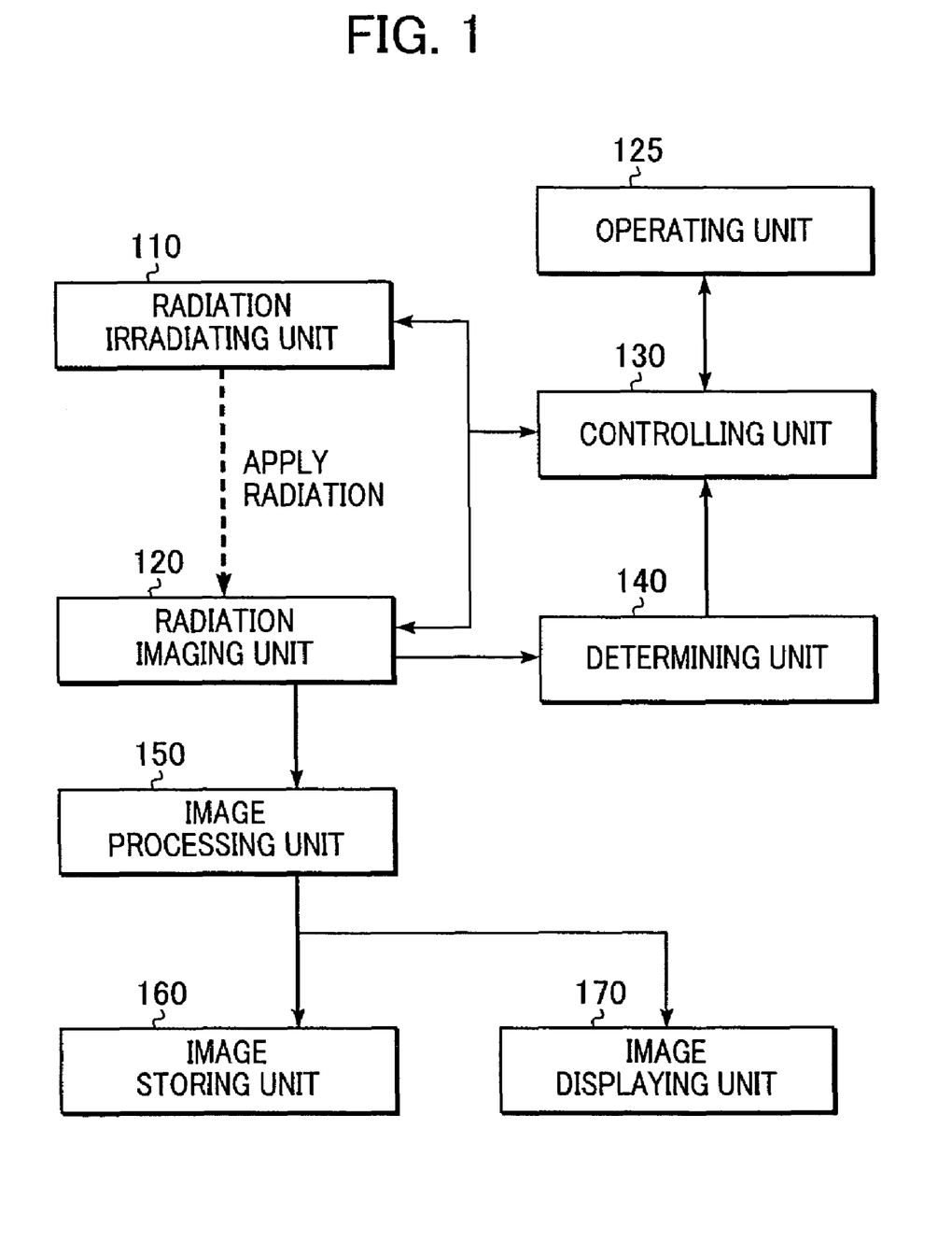
FIG. 1 is a block diagram showing the structure of a radiographic apparatus according to a first embodiment of the present invention.

FIG. 1 is a block diagram showing the structure of a radiographic apparatus according to a first embodiment of the present invention.

The radiographic apparatus has a radiation irradiating unit 110, an object being irradiated with radiation from the radiation irradiating unit 110; a radiation imaging unit 120, serving as a radiation imaging sensor, for converting a radiation projected image transmitted through the object into digital signals; a determining unit 140 for determining a state of the radiation imaging unit 120; an operating unit 125 with which radiographic information, such as conditions required for driving the radiographic apparatus, is input; and a controlling unit 130 for controlling the radiation irradiating unit 110 and the radiation imaging unit 120. In the following description, a state in which a low voltage is applied to the radiation imaging unit 120 and the radiographic apparatus is not ready for radiography is called a sleep state, and a state in which a normal voltage is applied to the radiation imaging unit 120 and the radiographic apparatus is ready for radiography is called a ready state. The sleep state and the ready state will be described in detail below with reference to FIGS. 2 and 3.

A radiographic process with the radiographic apparatus will now be described.

First, the radiographic information is input with the operating unit 125. After the radiographic information is input, the radiation imaging unit 120 changes from the sleep state without an applied voltage to the ready state with the applied voltage for capturing radiographic images. A radiographer transmits a radiation-irradiation starting signal to the controlling unit 130 with the operating unit 125. The controlling unit 130 causes the radiation imaging unit 120 to be ready to store radiation signals, and causes the radiation irradiating unit 110 to synchronously apply the radiation to the radiation imaging unit 120. The radiation imaging unit 120 converts the radiation into image data and acquires the image data, which is transmitted to the determining unit 140 and an image processing unit 150. The image data processed by the image processing unit 150 is stored in an image storing unit 160 and is displayed in an image displaying unit 170. Pressing an acknowledgement button on the operating unit 125 terminates one radiographic process.

When a subsequent radiographic process is to be performed within a predetermined time period after the radiographic process is completed, the radiation imaging unit 120 remains in the ready state without changing to the sleep state. When radiation having a high intensity is applied to the radiation imaging unit 120 in one radiographic process among continuous radiographic processes and the radiation imaging unit 120 has a part that is shielded from the radiation to some extent and a part that is irradiated with the radiation having a high intensity in its radiographic area, performing the subsequent radiographic process sometimes produces a residual image having noise superimposed on the image data. Hence, the determining unit 140 analyzes the image data acquired by the radiation imaging unit 120, determines whether a residual image occurs, and transmits the determined result to the controlling unit 130. The determining unit 140 particularly analyzes the part that is shielded from the radiation to some extent and the part that is irradiated with the radiation having a high intensity in the image data. If the determining unit 140 determines that the residual image occurs, the controlling unit 130 switches the radiation imaging unit 120 to the sleep state without the applied voltage. The sleep state without the applied voltage has an effect of resetting a residual charge causing the residual image. The controlling unit 130 then causes the radiation imaging unit 120 to change from the sleep state to the ready state for capturing a subsequent radiographic image.

If the controlling unit 130 switches the radiation imaging unit 120 to the sleep state each time a radiographic image is captured, a time period for changing from the sleep state to the ready state is required each time the radiographic image is captured, thus lengthening the radiographic cycle. As described above, switching the radiation imaging unit 120 to the sleep state and resetting the residual charge only when the image data causing the residual image is acquired during the continuous radiographic processes can take the radiographic images in an efficient radiographic cycle without the residual image.

Figure 2:
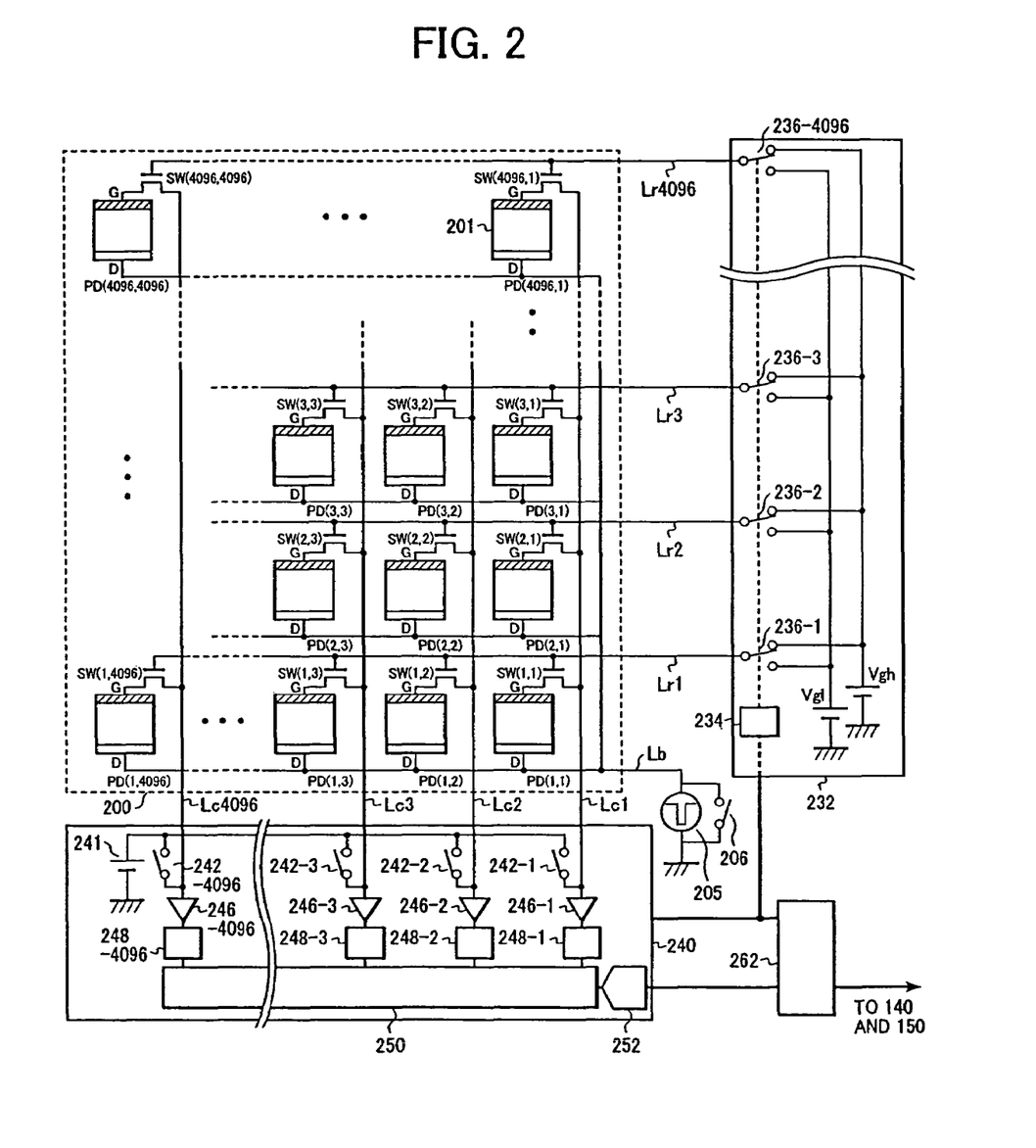
FIG. 2 illustrates the structure of a radiation imaging unit (120) in the radiographic apparatus, an operating principle thereof, and a driving method thereof.

FIG. 2 illustrates the structure of the radiation imaging unit 120 shown in FIG. 1, a driving method required for storing an electric charge converted from radiation and reading the electric charge, and the sleep state.

The radiation imaging unit 120 has a structure in which pixels for detecting signals are arranged as an array, which is called a detector array 200.

One pixel 201 has a signal detector for detecting radiation or optical signals and a switching TFT for switching between the storage of the signals and the readout thereof. Photoelectric transducers PD (1, 1) to (4096, 4096) correspond to the signal detectors and switches SW (1, 1) to (4096, 4096) correspond to the switching TFTs. Namely, the radiation imaging unit 120 has the signal detectors for 4096×4096 pixels. Hereinafter, a photoelectric transducer for the pixel in the m-th row and the n-th line is represented as a photoelectric transducer PD (m, n) and a switch for the pixel in the m-th row and the n-th line is represented as a switch SW (m, n). Applying different voltages to a gate electrode G of the photoelectric transducer PD (m, n) and a common electrode D of the photoelectric transducer PD (m, n) allows the storage and discharge of the electric charge. A photoelectric transducing part of the photoelectric transducer PD (m, n) is connected to the G electrode with an insulator sandwiched therebetween and is connected to the D electrode with a semiconductor sandwiched therebetween. A row signal line of the m-th row is represented as Lcm, and a line-selecting line of the n-th line is represented as Lrn. The radiation imaging unit 120 includes a bias line Lb, a bias supply 205, and a switch 206 for setting the bias line Lb to the ground level. The gate electrode G is connected to the row signal line Lcm for the m-th row through the corresponding switch SW (m, n), and the control terminal of the switch SW (m, n) is connected to the common line-selecting line Lrn. The common electrodes D of all the photoelectric transducers PDs (1, 1) to (4096, 4096) are connected to the bias supply 205 through the bias line Lb.

The radiation imaging unit 120 also has a line selector 232. The line selector 232 includes an address decoder 234 and 4096 switching elements 236-1 to 236-4096. The line selector 232 selects which line a signal charge of the pixel group is read out from. The line-selecting lines Lr1 to Lr4096 are connected to the line selector 232. The address decoder 234 decodes a control signal from a detector controlling unit and determines which photoelectric transducer PD (m, n) the signal charge is read out from. The switching elements 236 are opened and closed in accordance with the output from the address decoder 234.

The radiation imaging unit 120 further has a signal readout circuit 240 for reading out the signal charge of the pixel group. The stored charge in the photoelectric transducer PD (m, n) is reset with a reset reference voltage 241

Vbt. The signal readout circuit 240 includes reset switches 242, preamplifiers 246 for amplifying the signal voltage supplied from the row signal line Lcm, sample-hold circuits 248 for sampling and holding the output from the preamplifiers 246, an analog multiplexer 250 for multiplexing the output from the sample-hold circuits 248 in time base, and an analog-to-digital converter 252 for digitalizing the analog output from the analog multiplexer 250. The signal readout circuit 240 is connected to a driver 262 for driving the radiation imaging unit 120.

The basic driving operations in the radiation imaging unit 120, such as refreshing that is a state in which the electric charges stored in the photoelectric transducer PD (m, n) are discharged to eliminate the stored charge, the storage of the electric charge, the readout of the electric charge, and false readout, will be described below. The refreshing is required or is not required depending on the structure of the photoelectric transducer PD (m, n). One structure of the photoelectric transducer PD that requires the refreshing is a metal insulator semiconductor (MIS) structure.

The refreshing of the photoelectric transducer PD (m, n) will now be described.

The driver 262 applies a voltage to the bias supply 205 to set all the common electrodes D connected to the bias line Lb to a refreshing voltage Vr. The driver 262 also turns on all the reset switches 242 to set all the row signal lines Lc1 to Lc4096 to a reset reference voltage 241 Vbt. The driver 262 further applies a voltage Vgh to all the line-selecting lines Lr1 to Lr4096 to turn on all the switches SW (1, 1) to (4096, 4096) in order to set all the gate electrodes G to the reset reference voltage Vbt. Since the voltage difference Vbt–Vr exists between the reset reference voltage Vbt of the gate electrode G and the refreshing voltage Vr of the common electrode D, an extra electric charge in the capacitance of the photoelectric transducers PD (1, 1) to (4096, 4096) is discharged from the common electrodes D and the electric charge in the capacitance of the photoelectric transducers PD (1, 1) to (4096, 4096) is reset to a reference for refreshing.

The storage of the electric charge will now be described.

The driver 262 changes the voltage of the bias supply 205 to set all the common electrodes D connected to the bias line Lb to a bias voltage Vs during photoelectric conversion. The driver 262 also turns off all the reset switches 242 to release all the row signal lines Lc1 to Lc4096 from the reset reference voltage 241 Vbt. The driver 262 further applies a voltage Vg1 to all the line-selecting lines Lr1 to Lr4096 to turn off all the switches SW (1, 1) to (4096, 4096). The gate electrodes G are insulated from the photoelectric transducers PD (1, 1) to (4096, 4096). Reversing the relation between the voltage of the gate electrodes G and the bias voltage Vs of the common electrodes D, compared with the relation during the refreshing, allows the photoelectric transducers PD (1, 1) to (4096, 4096) to store the electric charge due to the photoelectric conversion because the common electrodes D are semiconductive to the photoelectric transducers PD (1, 1) to (4096, 4096). When the radiation imaging unit 120 is irradiated with radiation here, the electric charge in proportion to the amount of radiation is stored in the photoelectric transducers PD (1, 1) to (4096, 4096). A dark current excited by temperature, in addition to a radiation signal, flows through the photoelectric transducer PD (m, n), and the electric charge due to the dark current is also stored in the photoelectric transducers PD (1, 1) to (4096, 4096) together with the electric charge in proportion to the amount of radiation.

The readout of the electric charge will now be described.

The driver 262 turns on all the reset switches 242 with all the common electrodes D being set to the bias voltage Vs during the photoelectric conversion to set all the row signal lines Lc1 to Lc4096 to the reset reference voltage 241 Vbt. The driver 262 turns off all the reset switches 242 while maintaining the above state. The driver 262 further applies the voltage Vgh to the line-selecting line Lr1 to turn on the switches SW (1, 1) to (4096, 4096). Although turning on the switches SW (1, 1) to (4096, 4096) connects the row signal lines Lc1 to Lc4096 having the reset reference voltage Vbt to the gate electrodes G, the electric charge is stored in the photoelectric transducer PD (m, n) and, therefore, the voltage of the row signal lines Lc1 to Lc4096 is shifted from Vbt to Vbt' due to the induction of the electric charge stored in the photoelectric transducer PD (m, n). Since a shift amount Vbt–Vbt' is proportional to the amount of the stored charge, the shift amount Vbt–Vbt' is amplified by the preamplifiers 246. The output from the preamplifiers 246 is sampled and held by the sample-hold circuits 248, the output from the sample-hold circuits 248 is multiplexed by the analog multiplexer 250 in time base, and the analog output from the analog multiplexer 250 is digitized by the analog-to-digital converter 252 to read out the digitized data. Repeating this process for all the lines from 1 to 4096 allows the stored charge in all the pixels to be read out. The relation between the bias voltage Vs of the common electrodes D and the voltages Vbt or Vbt' of the gate electrodes G is the same as in the storage of the electric charge.

In order to read out only the stored charge in proportion to the amount of radiation, the electric charge due to the dark current is stored and read out again during the same time period, and the stored charge that is read out here is subtracted from the stored charge in all the pixels. In other words, subtracting a dark-current image read out in correction readout from the image data based on a radiation image read out in true readout by the driver 262 can provide the image data in proportion to the amount of radiation. The image data or the dark-current image is transmitted from the driver 262 to the determining unit 140 and the image processing unit 150.

The sleep state is a state in which the voltage of all the common electrodes D is set to the ground level by turning off the switches SW (1, 1) to (4096, 4096) and turning on the switch 206 to set the bias line Lb to the ground level. The sleep state has an effect of resetting the residual charge causing the residual image in the photoelectric transducers PD (1, 1) to (4096, 4096) with the common electrodes D having the ground level.

As described above with reference to FIG. 2, in order for the radiation imaging unit 120 to acquire the image data, it is necessary to apply a voltage to the detector array 200 to perform the storage, readout, and so on of the radiation signal.

After the pixels are irradiated with the radiation having a high intensity, a lot of electric charge is stored in the pixel group and, thus, it is sometimes impossible to sufficiently discharge the electric charge even by the refreshing described above. Consequently, the pixel irradiated with the radiation having a high intensity differs from other pixels in the readout output of the signal charge, thus possibly causing noise affected by the residual charge, that is, the residual image. Switching the radiation imaging unit 120 to the sleep state can eliminate the residual image, which is the noise caused by the residual charge. Furthermore, as the time period of the sleep state is lengthened, the effect of discharging the residual charge is improved. Accordingly, an intensive residual image that has been detected can be accommodated by lengthening the time period of the sleep state.

Figure 3:
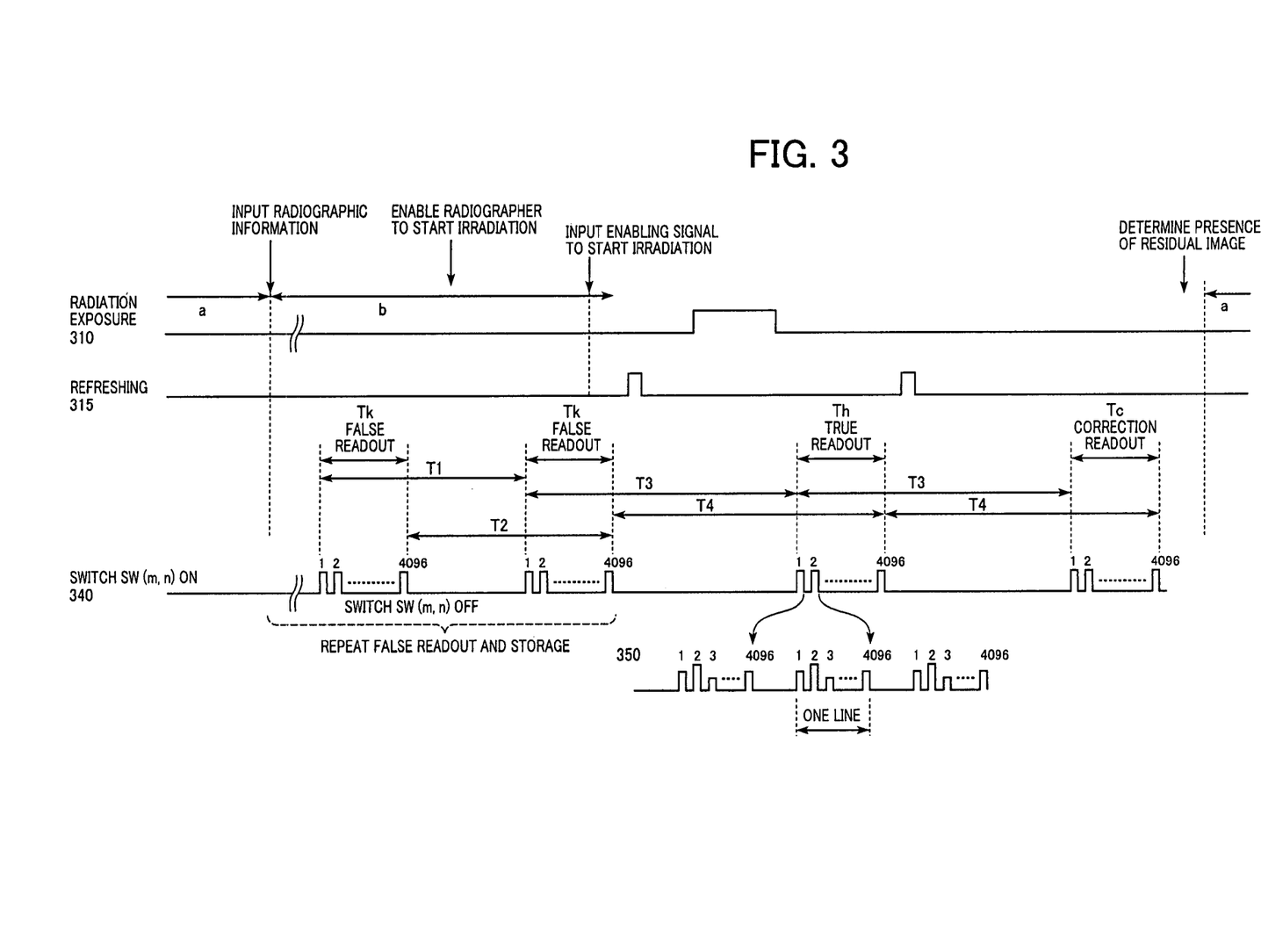
FIG. 3 is a time chart illustrating how a controlling unit drives and controls the radiation imaging unit (120).

FIG. 3 is a time chart illustrating how the controlling unit 130 drives and controls the radiation imaging unit 120.

Protruding rectangular portions of signals in FIG. 3 represent ON states, and flat portions thereof represent OFF states.

Referring to FIG. 3, reference numeral 310 denotes radiation exposure with the radiation irradiating unit 110. Reference numeral 315 denotes the refreshing (discharging the stored charge) described with reference to FIG. 2. Reference numeral 340 denotes an ON or OFF state of the switch SW (m, n) corresponding to the switching TFT in the detector array 200 in FIG. 2. Reference numeral 350 denotes the signal read out by the analog multiplexer 250 in the detector array 200 in FIG. 2. Turning on the switches SW for one line shown in 340 and 350 reads out the stored charge in the 4096 pixels from 1 to 4096.

The radiation imaging unit 120 is in the sleep state in a period a in FIG. 3. When the radiographic information is input with the operating unit 125 during the sleep state, the radiation imaging unit 120 changes to the ready state in a period b in FIG. 3. One cycle of the storage and readout of the electric charge described with reference to FIG. 2 is repeated in the ready state. The readout of the electric charge when the radiation is not applied to the radiation imaging unit 120 is called false readout. This false readout is known as a method of simply discharging the dark current. Particularly, in the ready state, repeating the storage and readout of the electric charge has an effect of stabilizing the level of the dark current in the radiation imaging unit 120. However, it is difficult to discharge intensive residual charge only with the false readout.

Since the output level of the dark current is increased after the ready state, it is necessary to lengthen the ready state to some extent by repeating the above cycle. When the output level of the dark current is stabilized, an enabling signal indicating that the radiographer can start applying the irradiation is input with the operating unit 125. The electric charge is stored in a predetermined time period in the ready state. When the enabling signal indicating that the radiographer can start applying the irradiation is input with the operating unit 125 in the ready state, the controlling unit 130 switches the radiation imaging unit 120 to the refreshing state upon completion of one cycle described above to discharge the electric charge of the photoelectric transducer PD (m, n). The radiation imaging unit 120 then changes to the storage state. After the radiation imaging unit 120 changes to the storage state, the controlling unit 130 causes the radiation irradiating unit 110 to synchronously apply the radiation to the radiation imaging unit 120. After the application of the radiation is completed, the controlling unit 130 reads out the electric charge from the radiation imaging unit 120 as the image data. Since, at this time, the signal charge has been stored after the application of the radiation, this readout is called true readout. The controlling unit 130 then causes the radiation imaging unit 120 to perform the refreshing to store the electric charge and read out the dark-current image in the same cycle as in the proximate storage and true readout. This readout, which is performed for estimating the value of the dark current in a true radiographic process, is called correction readout. After the correction readout is completed, the determining unit 140 determines the occurrence of the residual image based on the image data read out in the true readout or the dark-current image read out in the correction readout. The controlling unit 130 determines whether the radiation imaging unit 120 is changed to the sleep state or to the ready state in response to the determination by the determining unit 140. Specifically, if the determining unit 140 determines that the residual image occurs in a radiographic process subsequent to the second one among the continuous radiographic processes, the sleep state occurs in the period a in FIG. 3. Since a large dark current is output after the sleep state, the ready state in the period b in FIG. 3 is kept until the output of the dark current is stabilized, and, therefore, the period b is lengthened. If the determining unit 140 determines that no residual image occurs, the ready state occurs in the period a in FIG. 3 and the period a is greatly shortened, compared with a case where the sleep state occurs in the period a. If the determining unit 140 determines that no residual image occurs, the period a in FIG. 3 may be omitted. Since the output level of the dark current has already been stabilized if the sleep state does not occur in the period a, the ready state in the period b can be greatly shortened, compared with a case where the ready state occurs after the sleep state. If the continuous radiographic processes are completed or if no radiographic information is input and timeout occurs, the controlling unit 130 switches the radiation imaging unit 120 to the sleep state.

As described above, if the determining unit 140 determines that no residual image occurs, continuing the radiographic process in the ready state without changing to the sleep state has an effect of shortening the photographic cycle. In contrast, if the determining unit 140 determines that the residual image occurs, changing to the sleep state has an effect of resetting the residual charge causing the residual image to provide the image data without the residual image.

As described with reference to FIG. 2, subtracting the dark-current image read out in the correction readout from the image data based on the radiation read out in the true readout can provide the image data in proportion to the amount of radiation.

The sleep state described with reference to FIGS. 2 and 3 is a state in which the voltage of all the common electrodes D is set to the ground level by turning off the switches SW (1, 1) to (4096, 4096) and turning on the switch 206 to set the bias line Lb to the ground level. The sleep state has an effect of resetting the residual charge causing the residual image in the photoelectric transducers PD (1, 1) to (4096, 4096) based on the common electrodes D set to the ground level. As the period of the sleep state is lengthened, this effect can be increased.

Similar effects can be achieved by increasing the voltage difference Vbt–Vbt' more than usual in the refreshing described with reference to FIG. 2. This is because increasing the voltage difference Vbt–Vbt' more than usual increases the effect of discharging the residual charge in the capacitance in the photoelectric transducers PD (1, 1) to (4096, 4096) from the common electrodes D.

Hence, the period a in FIG. 3 is not limited to the sleep state and can be in any state having an effect of discharging the residual charge causing the residual image. It is important for the radiation imaging unit 120 to discharge the residual charge causing the residual image if the determining unit 140 determines that the residual image occurs, and not to perform an operation lengthening the radiographic cycle, such as the discharge of the residual charge, if the determining unit 140 determines that no residual image occurs. Accordingly, if the determining unit 140 determines that no residual image occurs, continuing the radiographic process in the ready state has an effect of shortening the radiographic cycle. In contrast, if the determining unit 140 determines that the residual image occurs, the discharge of the residual charge has an effect of resetting the residual charge causing the residual image to provide the image data without the residual image.

Although the driving operations described with reference to FIGS. 2 and 3 are performed by the radiation imaging unit 120 using the MIS photoelectric transducers, similar residual images are also generated in the radiation imaging unit 120 using NiP photoelectric transducers or using layered photoelectric transducers made of amorphous selenium. Such radiation imaging units are described in detail in "Handbook of Medical Imaging Volume 1, Physics and Psychophysics", Chapter 4, p. 274. An example of driving the NiP photoelectric transducers is described in "Operation of Amorphous Silicon Detectors for Chest Radiography System Latency Requirements", SPIE Medical Imaging: Physics of Medical Imaging Vol. 3659, 1999.

Figure 4:
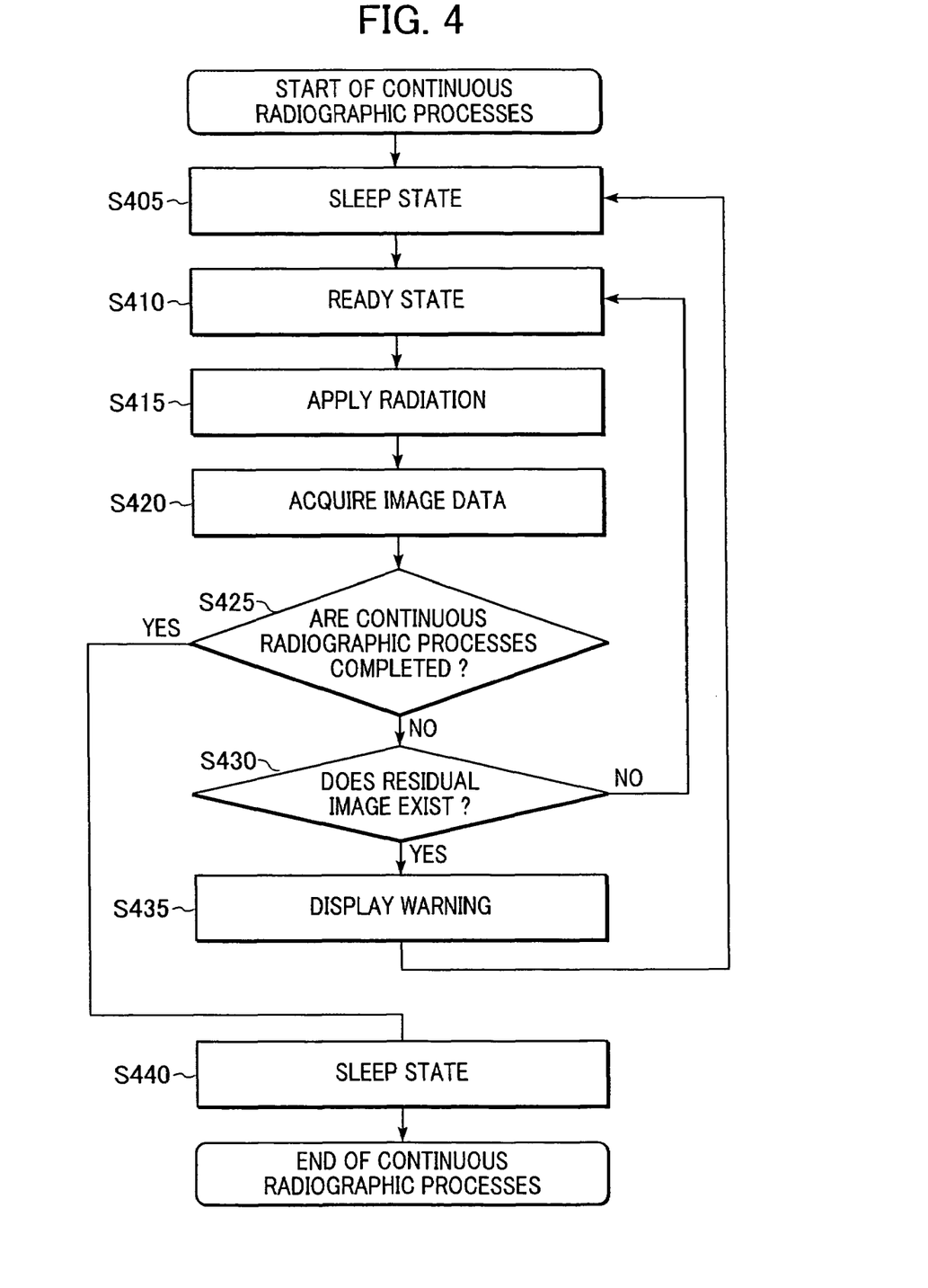
FIG. 4 is a flowchart of capturing radiographic images by the radiographic apparatus according to the first embodiment of the present invention.

FIG. 4 is a flowchart of capturing radiographic images by the radiographic apparatus according to the first embodiment of the present invention.

In Step S405, the controlling unit 130 switches the radiation imaging unit 120 to the sleep state if the radiation imaging unit 120 has not been used for capturing radiographic images for a predetermined time period. In Step S410, the controlling unit 130 switches the radiation imaging unit 120 to the ready state upon reception of information concerning the start of the radiographic process with the operating unit 125. In Step S415, the controlling unit 130 controls the radiation irradiating unit 110 so as to apply radiation to the radiation imaging unit 120. In Step S420, the radiation imaging unit 120 irradiated with the radiation acquires image data under the control of the controlling unit 130. In Step S425, the controlling unit 130 determines whether continuous radiographic processes are completed. If the radiographic processes are completed, in Step S440, the controlling unit 130 immediately switches the radiation imaging unit 120 to the sleep state. If the radiographic processes are not completed, in Step S430, the determining unit 140 determines whether a residual image occurs in the acquired image data. If no residual image occurs, in Step S410, the controlling unit 130 continues the radiographic process in the ready state. If the residual image occurs, in Step S435, the controlling unit 130 displays a warning in a displaying unit (not shown). Then, in Step S405, the controlling unit 130 switches the radiation imaging unit 120 to the sleep state.

The radiographic process according to the flowchart described above has effects of shortening the radiographic cycle if the determining unit 140 determines that no residual image occurs, and of acquiring the image data without the residual image if the determining unit 140 determines that the residual image occurs.

Figure 5:
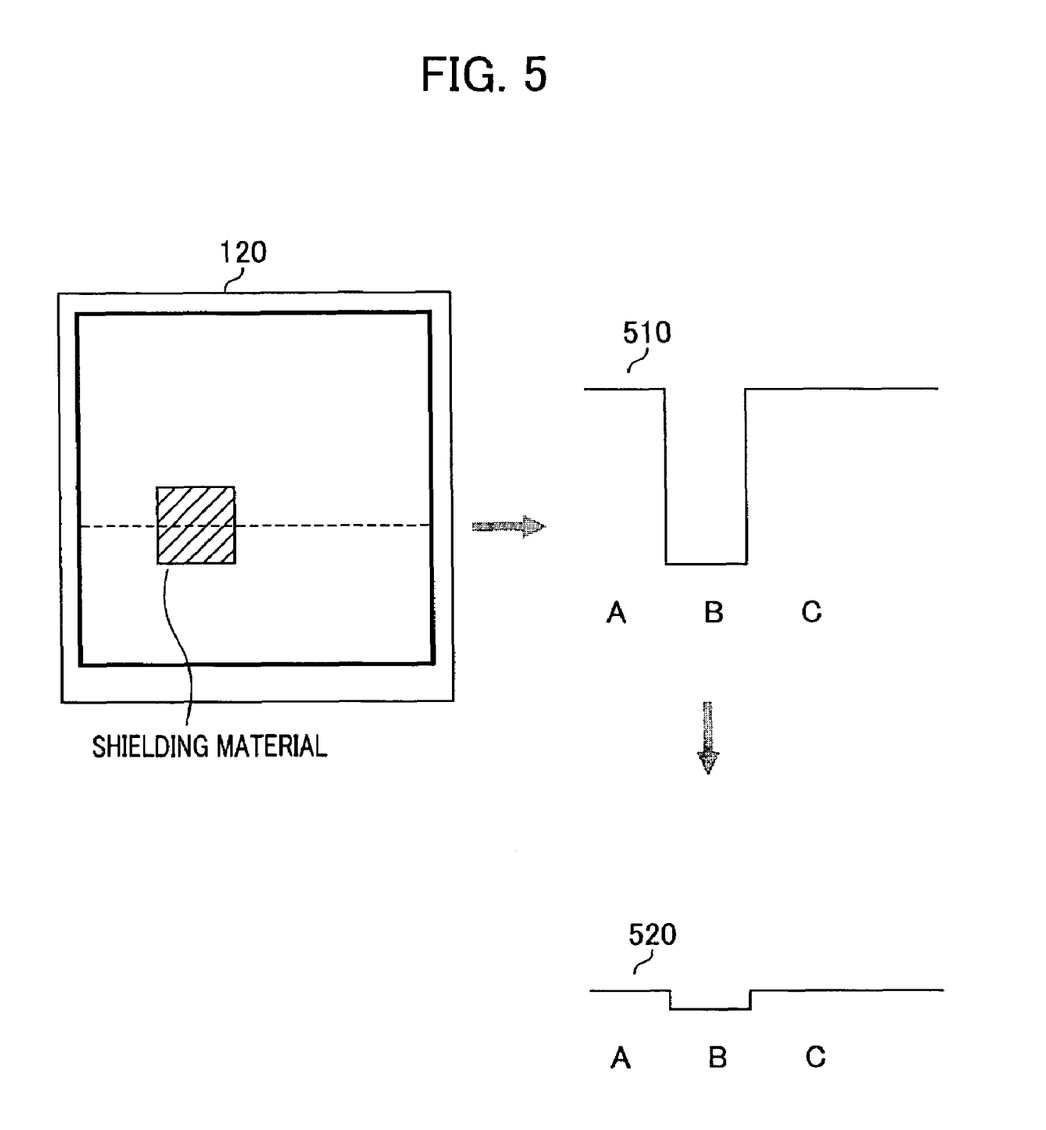
FIG. 5 illustrates a residual image and the cause of the residual image.

FIG. 5 illustrates the cause of the residual image determined by the determining unit 140.

Reference numeral 510 represents an image-data profile, taken along a broken line in FIG. 5, which is the profile of the image data from which the dark-current image is subtracted. Reference numeral 520 represents the distribution of the residual charge in the pixel group corresponding to the image-data profile 510.

When high-intensity radiation is applied to the radiation imaging unit 120 part of which is covered with shielding material, the acquired image data has high contrast, as shown in the image-data profile 510. The residual charge in the pixel group corresponding to the image-data profile 510 after the readout has been performed once is distributed as shown in the distribution 520. Since pixels A and C in FIG. 5 differ from a pixel B in the response to the radiation owing to the residual charge, the residual image occurs in the image data in the subsequent radiographic process. In other words, no residual image occurs if the residual charge is uniformly distributed without variation, while noise is superimposed as the residual image if the distribution of the residual charge is varied. Decreasing the residual charge toward zero suppresses the occurrence of the residual image. Also in this case, the residual charge is uniformly distributed.

The distribution of pixel values is varied in dark-current image. This variation is highly correlated with the distribution of the residual charge.

Particularly, the distribution of the residual charge is proximate to the distribution of the pixel values in the radiographic image. The residual image is called the residual image because the subsequent radiographic image is captured as if it had the previous image added.

Figure 6:
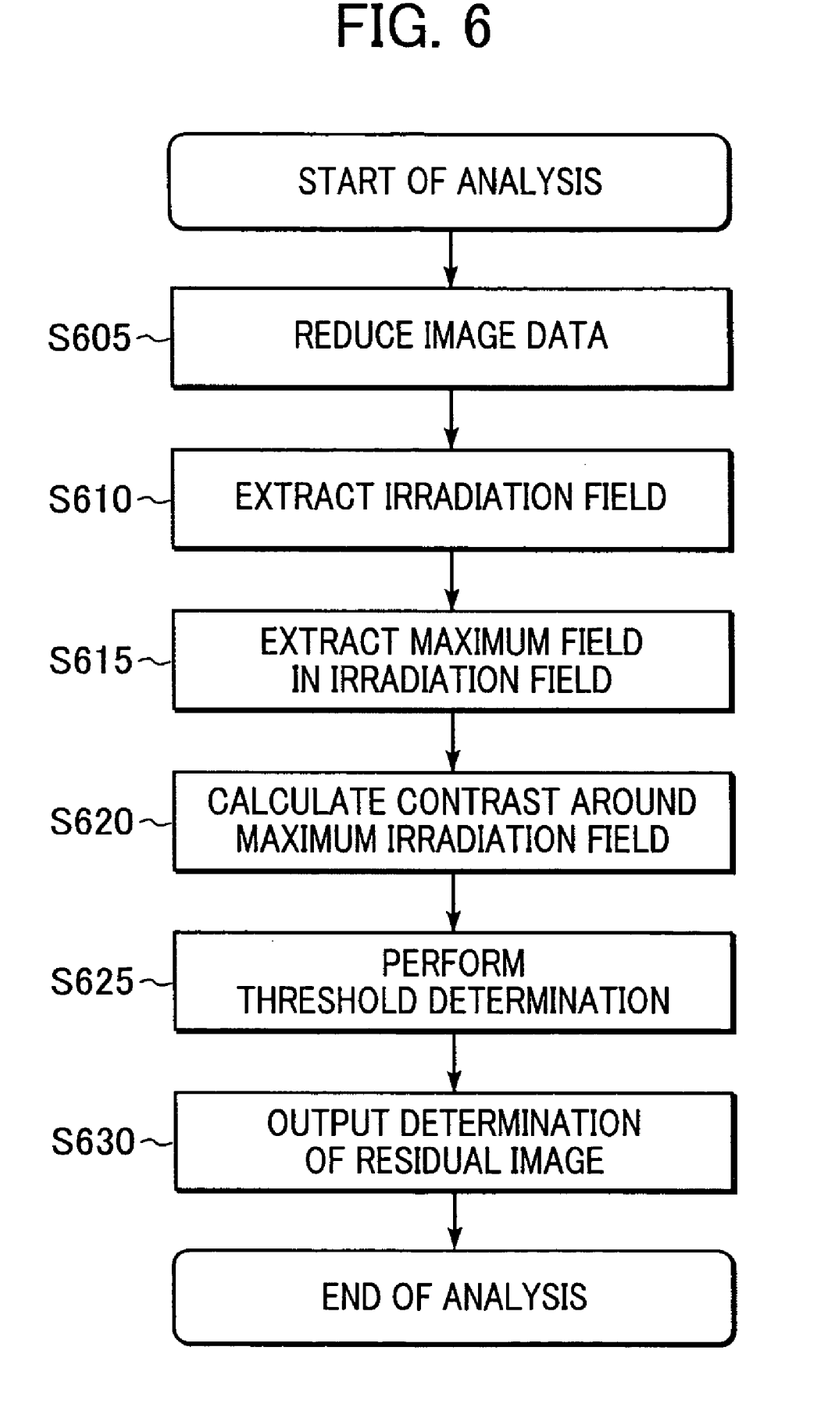
FIG. 6 is a flowchart of analyzing image data for the determination of the residual image by a determining unit (140).

FIG. 6 is a flowchart of analyzing the image data for the determination of the residual image by the determining unit 140.

The criterion of determining that the residual image occurs in FIG. 6 is whether the image data in proportion to the amount of radiation has high contrast when the radiation imaging unit 120 is irradiated with the high-intensity radiation, as shown in FIG. 5.

In Step S605, the determining unit 140 reduces the image data. In Step S610, the determining unit 140 extracts an irradiation field of the radiation from the reduced image data. The irradiation field irradiated with the radiation is generated by an aperture in the radiation irradiating unit 110. A detailed method of extracting the irradiation field is disclosed in Japanese Patent Laid-Open No. 2000-271107. After the irradiation field has been extracted, in Step S615, the determining unit 140 extracts a maximum irradiation field having a maximum pixel value from the image data in the irradiation field. As the amount of applied radiation is increased, the pixel value of the image data is increased. The maximum irradiation field is a field having a pixel value whose difference from the maximum value is within, for example, 5% of the maximum value. The determining unit 140 extracts an area A having higher pixel values by creating an accumulated histogram of the pixel values in the irradiation field, obtaining the pixel values, for example, in the top 10% thereof, and identifying the pixels corresponding to the acquired pixel values. In Step S620, the determining unit 140 calculates the contrast (CNT) between the pixel value and a peripheral value for every pixel in the area A. The contrast (CNT) can be given by expression (1), where the reduced image data is represented by F (X, Y), and the coordinate in the image data is represented by (X, Y). In expression (1), CNT (X, Y) denotes a maximum contrast in the contrasts calculated between a pixel F (X, Y) and a pixel F (X+k×d, Y+k×d) within a distance d with respect to the coordinate (X, Y).

$$CNT(X, Y) = \max[\{F(X, Y) - F(X+k \times d, Y+k \times d)\}/F(X, Y)]$$
Formula 1 where (X, Y)∈A, k denotes an integer from −2 to 2, and d denotes a distance (for example, 3 mm).

In Step S625, the determining unit 140 performs threshold determination according to expression (2). Expression (2) means that the determining unit 140 determines that the residual image occurs if the number of pixels having values exceeding a contrast threshold H exceeds NH among the contrasts CNT (X, Y) calculated in the area A.

$$\Sigma 1(X1, Y1) \geq NH \quad \text{Formula 2}$$

$$(X1, Y1) \in \{CNT(X, Y) \geq H, (X, Y) \in A\}$$

where 1 (X, Y) denotes a constant function of value one, H denotes a contrast threshold, and NH denotes a threshold when the determining unit 140 determines that the residual image occurs.

In Step S630, the determining unit 140 transmits the determination result to the controlling unit 130, which performs the controlling operations shown in FIGS. 1 to 4 based on the determination result of the residual image.

As described above, determining the distribution of the residual charge based on the image data can accurately determine whether the residual image occurs. Particularly, determining the variation in the distribution of the residual charge based on the contrast has an effect of accurately determining whether the residual image occurs or whether noise caused by the residual charge is superimposed on the image data.

Figure 7:
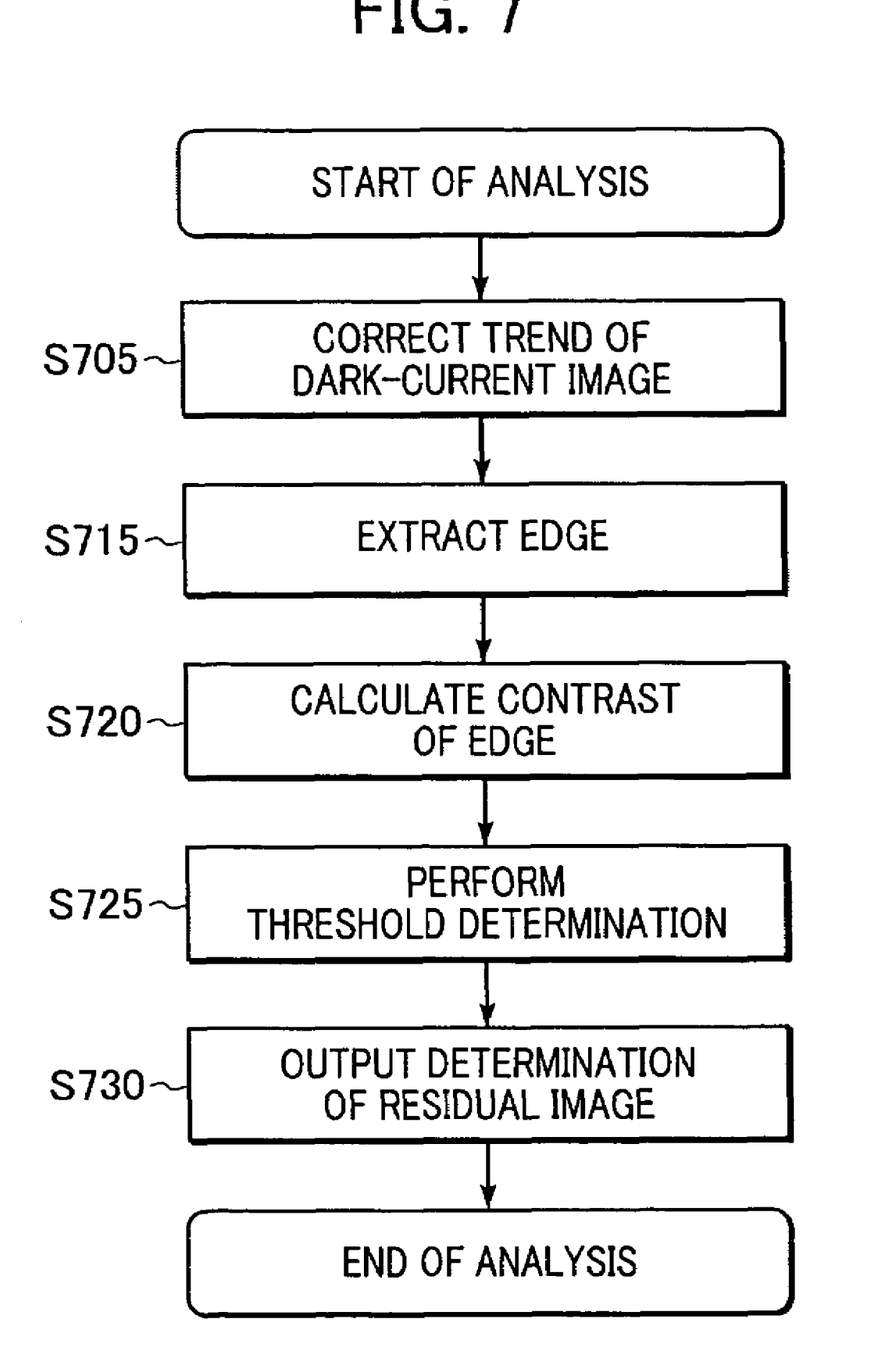
FIG. 7 is a flowchart of analyzing a dark-current image for the determination of the residual image by the determining unit (140).

FIG. 7 is a flowchart of analyzing the dark-current image for the determination of the residual image by the determining unit 140.

As shown in FIG. 5, applying the radiation having a high intensity provides a distribution of the residual charge in the pixel group. Since the amount of the dark current depends on the amount of the residual charge in the capacitance in the photoelectric transducer PD, the dark-current image has a distribution similar to that of the residual charge. In other words, analyzing the distribution of the dark-current image read out in the correction readout immediately after the true readout allows the determining unit 140 to determine whether the residual image occurs in the subsequent radiographic process. The analysis flow of the dark-current image for determining whether the residual image occurs will follow.

First, the determining unit 140 acquires two images given by averaging the dark-current images in an X-direction line and a Y-direction line. In Step S705, the determining unit 140 corrects the trend of the dark-current image by dividing the dark-current image twice by the two line-averaged images. In Step S715, the determining unit 140 scans the profile of each line in the dark-current image whose trend has been corrected to extract an edge. The edge is extracted in the same manner as in the method of extracting an edge in the irradiation field disclosed in Japanese Patent Laid-Open No. 2000-271107. For example, the edge in the X-direction line at Y=Y2 is extracted according to expressions (3) and (4), where F (X, Y) denotes the dark-current image whose trend has been corrected.

Expression (4) indicates that the coordinate (X, Y2) of S2 (X, Y2) having a value not less than a predetermined value E is positioned near the edge.

$$S1(X, Y2) = F(X, Y2) - F(X-d, Y2) \quad \text{Formula 3}$$

where d denotes a distance (for example, 3 mm).

$$S2(X, Y2) = |\{S1(X+d, Y2) - S1(X, Y2)\}| \geq E \quad \text{Formula 4}$$

where E denotes a threshold in the extraction of the edge.

The value X satisfying expression (4) is kept for every line. The extraction is also performed for every Y-direction line. In Step S720, the determining unit 140 calculates the contrast for all 4the extracted edges. For example, the contrast CNT2 of X=X2 for which the edge has been extracted in the X-direction line at Y=Y2 is calculated according to expression (5).

$$CNT2(X2, Y2) = \{F(X2+d2, Y2) - F(X2, Y2)\}/F(X2, Y2) \quad \text{Formula 5}$$

where d2 denotes a distance (for example, 3 mm).

In Step S725, the determining unit 140 performs threshold determination for the contrasts of all the edges that have been extracted and calculated according to expression (6).

$$\Sigma 1(X3, Y3) \geq NEH \quad \text{Formula 6}$$

$(X3, Y3) \in \{|CNT2(X, Y)| \geq EH, (X, Y)$: all areas in the dark-current image$\}$ where 1 (X, Y) denotes a constant function of value one, EH denotes a contrast threshold, and NEH denotes a threshold in the determination that the residual image occurs.

Accordingly, the determining unit 140 determines that the residual image occurs if the sum $\Sigma 1$ (X3, Y3) of the constant function of value one is greater than or equal to NEH. In Step S730, the determining unit 140 transmits the determination result to the controlling unit 130, which performs the controlling operations shown in FIGS. 1 to 4 based on the determination result of the residual image.

As described above, determining the distribution of the residual charge based on the dark-current image has an effect of determining the occurrence of the residual image or of determining the superimposition of noise caused by the residual charge. According to the radiographic apparatus of the first embodiment, determining the occurrence of the residual image after the application of high-intensity radiation and performing a driving operation of discharging the residual charge in the time between the radiographic processes if required can capture the radiographic image without the residual image. In addition, ordinal radiographic processes without the residual image are performed in a short radiographic cycle, thus efficiently capturing the radiographic images. Furthermore, there is no need to add a reset device, thus saving the space of the reset device and the cost thereof.

The determination of the state of the residual charge can realize a radiographic apparatus and a radiographic method capable of reducing the superimposition of noise caused by the residual charge on the image data.

Other Embodiments

The present invention is not limited to the structure and method according to the first embodiment described above. The present invention may be applied to a system having a plurality of devices or to an apparatus including one device.

The present invention can be embodied by directly or remotely supplying a software program that realizes the functions of the above embodiment to the system or the apparatus, the computer of which reads out the supplied program code to execute it. In this case, the program may be in any other form as long as it has the function of the program.

Accordingly, the present invention is embodied by the program code itself installed in the computer for enabling the computer to realize the functions of the present invention. In other words, the computer program for realizing the functions of the present invention is also included in the appended claims.

In such a case, the program may be in any form, such as object code, a program executed by an interpreter, or script data supplied to the OS, as long as they have the function of the program.

Storage media used for supplying the program include a floppy disk, a hard disk, an optical disc, a magneto-optical disk, an MO, a CD-ROM, a CD-R, a CD-RW, a magnetic tape, a nonvolatile memory card, a ROM, and a DVD (DVD-ROM and DVD-R).

The program may be supplied by accessing an Internet home page by using the browser in a client computer to download the computer program itself or a compressed file including an automatic installation function from the home page to a storage medium such as a hard disk. The program code constituting the program of the present invention may be divided into multiple files, which are downloaded from different home pages. In other words, a world wide web (WWW) server from which the program file for enabling the computer to realize the functions of the present invention is downloaded to multiple users is also included in the appended claims of the present invention.

Alternatively, the program according to the present invention, which is encrypted and stored in a storage medium such as a CD-ROM, may be distributed to users, cryptographic-key information for deciphering the code may be supplied from a home page to users who satisfy predetermined conditions over the Internet, and the users may install in the computer the program deciphered by using the cryptographic-key information.

The functions according to the above embodiment can be realized by the computer that reads out and executes the program, and can also be realized by the OS, running on the computer or the like, which executes all or part of the actual processing based on the instructions in the program.

Furthermore, after the program code read out from the storage medium has been written in a memory that is provided in an expansion board included in the computer or in an expansion unit connected to the computer, the CPU or the like in the expansion board or the expansion unit can execute all or part of the actual processing based on the instructions in the program to realize the functions of the above embodiment.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A radiographic apparatus comprising:
a radiation irradiating unit for applying radiation;
a radiation imaging unit, including a plurality of imagers, for converting the radiation to image data;
a determining unit for determining whether noise caused by residual charge is produced, from a distribution of the residual charge in the radiation imaging unit based on the image data; and
a controlling unit for changing a driving state of the radiation imaging unit based on the determination result.

2. A radiographic apparatus according to claim 1,
wherein the determining unit determines that the noise is produced if the distribution of the residual charge is varied.

3. A radiographic apparatus according to claim 2,
wherein the determining unit determines the variation in the distribution of the residual charge based on a contrast of the image data.

4. A radiographic apparatus according to claim 3,
wherein the determining unit determines the variation in the distribution of the residual charge based on a contrast in an area having high pixel values in the image data.

5. A radiographic apparatus according to claim 4,
wherein the determining unit determines that the distribution of the residual charge is varied if the contrast of the image data exceeds a predetermined value.

6. A radiographic apparatus according to claim 4,
wherein the controlling unit drives the radiation imaging unit so as to flatten the distribution of the residual charge in the radiation imaging unit or so as to reduce the residual charge, if the determining unit determines that the distribution of the residual charge is varied.

7. A radiographic apparatus according to claim 4,
wherein the controlling unit reduces at least one of a voltage and a current supplied to the radiation imaging unit, if the determining unit determines that the distribution of the residual charge is varied.

8. A radiographic apparatus according to claim 4,
wherein the controlling unit changes the radiation imaging unit to a sleep state, if the determining unit determines that the distribution of the residual charge is varied.

9. A radiographic apparatus according to claim 3,
wherein the determining unit determines that the distribution of the residual charge is varied if the contrast of the image data exceeds a predetermined value.

10. A radiographic apparatus according to claim 3,
wherein the controlling unit drives the radiation imaging unit so as to flatten the distribution of the residual charge in the radiation imaging unit or so as to reduce the residual charge, if the determining unit determines that the distribution of the residual charge is varied.

11. A radiographic apparatus according to claim 3,
wherein the controlling unit reduces at least one of a voltage and a current supplied to the radiation imaging unit, if the determining unit determines that the distribution of the residual charge is varied.

12. A radiographic apparatus according to claim 3,
wherein the controlling unit changes the radiation imaging unit to a sleep state, if the determining unit determines that the distribution of the residual charge is varied.

13. A radiographic apparatus according to claim 2,
wherein the determining unit determines the variation in the distribution of the residual charge based on a contrast of the image data acquired by the radiation imaging unit without the radiation being applied.

14. A radiographic apparatus according to claim 13,
wherein the determining unit determines that the distribution of the residual charge is varied if the contrast of the image data exceeds a predetermined value.

15. A radiographic apparatus according to claim 13,
wherein the controlling unit drives the radiation imaging unit so as to flatten the distribution of the residual charge in the radiation imaging unit or so as to reduce the residual charge, if the determining unit determines that the distribution of the residual charge is varied.

16. A radiographic apparatus according to claim 13,
wherein the controlling unit reduces at least one of a voltage and a current supplied to the radiation imaging unit, if the determining unit determines that the distribution of the residual charge is varied.

17. A radiographic apparatus according to claim 13, wherein the controlling unit changes the radiation imaging unit to a sleep state, if the determining unit determines that the distribution of the residual charge is varied.

18. A radiographic apparatus according to claim 2, wherein the determining unit determines that the distribution of the residual charge is varied if the contrast of the image data exceeds a predetermined value.

19. A radiographic apparatus according to claim 2, wherein the controlling unit drives the radiation imaging unit so as to flatten the distribution of the residual charge in the radiation imaging unit or so as to reduce the residual charge, if the determining unit determines that the distribution of the residual charge is varied.

20. A radiographic apparatus according to claim 2, wherein the controlling unit reduces at least one of a voltage and a current supplied to the radiation imaging unit, if the determining unit determines that the distribution of the residual charge is varied.

21. A radiographic apparatus according to claim 2, wherein the controlling unit changes the radiation imaging unit to a sleep state, if the determining unit determines that the distribution of the residual charge is varied.

22. A radiographic apparatus according to claim 1, wherein the determining unit determines that the distribution of the residual charge is varied if the contrast of the image data exceeds a predetermined value.

23. A radiographic apparatus according to claim 1, wherein the controlling unit drives the radiation imaging unit so as to flatten the distribution of the residual charge in the radiation imaging unit or so as to reduce the residual charge, if the determining unit determines that the distribution of the residual charge is varied.

24. A radiographic apparatus according to claim 1, wherein the controlling unit reduces at least one of a voltage and a current supplied to the radiation imaging unit, if the determining unit determines that the distribution of the residual charge is varied.

25. A radiographic apparatus according to claim 1, wherein the controlling unit changes the radiation imaging unit to a sleep state, if the determining unit determines that the distribution of the residual charge is varied.

26. A radiographic method comprising:

a radiation irradiating step for applying radiation;

a radiation imaging step for converting the radiation to image data by using a plurality of imagers;

a determining step for determining whether noise caused by residual charge is produced, from a distribution of the residual charge based on the image data obtained in the radiation imaging step; and a controlling step for changing a driving state of the radiation imaging step based on the determination result.

* * * * *